(12) United States Patent
Naruse

(10) Patent No.: US 7,521,843 B2
(45) Date of Patent: Apr. 21, 2009

(54) PIEZOELECTRIC DEVICE

(75) Inventor: Hideto Naruse, Ebina (JP)

(73) Assignee: Epson Toyocom Corporation, Tokyo (JP)

( * ) Notice: Subject to any disclaimer, the term of this patent is extended or adjusted under 35 U.S.C. 154(b) by 70 days.

(21) Appl. No.: 11/785,221

(22) Filed: Apr. 16, 2007

(65) Prior Publication Data

US 2007/0273250 A1 Nov. 29, 2007

(30) Foreign Application Priority Data

May 24, 2006 (JP) ............................. 2006-143735

(51) Int. Cl.
*H01L 41/08* (2006.01)
(52) U.S. Cl. ................................................. 310/344
(58) Field of Classification Search ............. 310/313 R, 310/344, 348
See application file for complete search history.

(56) References Cited

U.S. PATENT DOCUMENTS 4,471,259 A * 9/1984 Stoermer et al. ............ 310/353
6,703,768 B2 * 3/2004 Kageyama et al. .......... 310/344
6,734,605 B2 * 5/2004 Kinoshita .................... 310/348
6,833,654 B2 * 12/2004 Rubach ....................... 310/344
6,960,870 B2 * 11/2005 Kikushima et al. .......... 310/344
7,256,659 B2 * 8/2007 Mizumura et al. ............ 331/68
7,259,501 B2 * 8/2007 Usuda ......................... 310/344
7,378,780 B2 * 5/2008 Mizumura et al. .......... 310/341

FOREIGN PATENT DOCUMENTS

JP   A 03-272207   12/1991

* cited by examiner

*Primary Examiner*—Mark Budd
(74) *Attorney, Agent, or Firm*—Oliff & Berridge, PLC

(57) ABSTRACT

A piezoelectric device includes: a package including a first recessed part provided on a first surface of the package, a second recessed part provided on a second surface of the package, and a penetrating part passing partially from the first recessed part through the second recessed part; a piezoelectric element housed in the first recessed part; a lid disposed on the upper side of the first recessed part; an IC chip disposed and fixed in the second recessed part of the package so as to block a part of the penetrating part; and a sealing part provided to the second recessed part. The IC chip and the sealing part close up the penetrating part and the lid seals the first recessed part air-tightly. A piezoelectric device is provided. The piezoelectric device realizes thickness reduction thereof without undergoing warpage and breakage of an IC chip or a package thereof.

2 Claims, 4 Drawing Sheets

PIEZOELECTRIC DEVICE

BACKGROUND

1. Technical Field

The present invention relates to a piezoelectric device.

2. Related Art

Piezoelectric devices are provided with a piezoelectric resonator typified by a quartz crystal resonator, and an oscillation circuit. The piezoelectric devices have conventionally been used as clock frequency sources of various electronic apparatuses such as a personal computer or a mobile communication device.

As electronic apparatuses mounting piezoelectric devices are miniaturized and thinned, the piezoelectric devices are also required to be further miniaturized and thinned. For example, JP-A-3-272207, FIG. 1, pp. 4-6 discloses a piezoelectric device. The piezoelectric device has such structure that an IC chip is disposed in a housing recessed part formed in a package made of ceramic, a piezoelectric element is disposed above the IC chip, and the housing recessed part is sealed air-tightly by a lid.

In the structure of the related art piezoelectric device, it is required to make the IC chip thinner or reduce the thickness of the bottom of the housing recessed part housing the IC chip in order to realize further miniaturization and especially further thickness reduction of the device. However, making the devices thinner causes warpage and breakage of the IC chip or the package. Thus, it is difficult to realize thinner piezoelectric devices in the related art structure.

SUMMARY

An advantage of the present invention is to provide a piezoelectric device realizing thickness reduction thereof without undergoing warpage and breakage of an IC chip or a package thereof.

A piezoelectric device according to an aspect of the invention includes: a package having a first recessed part provided on a first surface, a second recessed part provided on a second surface, and a penetrating part passing partially from the first recessed part through the second recessed part; a piezoelectric element housed in the first recessed part; a lid disposed on the upper side of the first recessed part; an IC chip disposed and fixed in the second recessed part of the package so as to block a part of the penetrating part; and a sealing part provided to the second recessed part. The IC chip and the sealing part close up the penetrating part, and the lid seals the first recessed part air-tightly.

In this structure, the IC chip is disposed and fixed in the second recessed part by an adhesive made of resin having bonding power, such as epoxy resin so as to block at least a part of the penetrating part formed in the package. Then the sealing part made of resin having bonding power such as epoxy resin, is provided to a space surrounding the lateral faces of the IC chip in the second recessed part. Thus, the penetrating part is closed up by the IC chip and the sealing part. The IC chip is disposed in the second recessed part. Therefore, compared to the related art structure in which the IC chip is disposed on the bottom surface of the package recessed part forming the housing recessed part, the quartz crystal oscillator realizes the thickness reduction thereof by the thickness of the bottom of the housing recessed part without undergoing warpage and breakage of the IC chip or the package.

In the piezoelectric device of the aspect, at least one lateral face of the second recessed part may be opened.

In this structure, the second recessed part can house a larger IC chip than the IC chip housed in the related art housing recessed part.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the present invention will now be described with reference to the accompanying drawings.

First Embodiment

A first embodiment illustrates a quartz crystal oscillator as a piezoelectric device.

Figure 1:
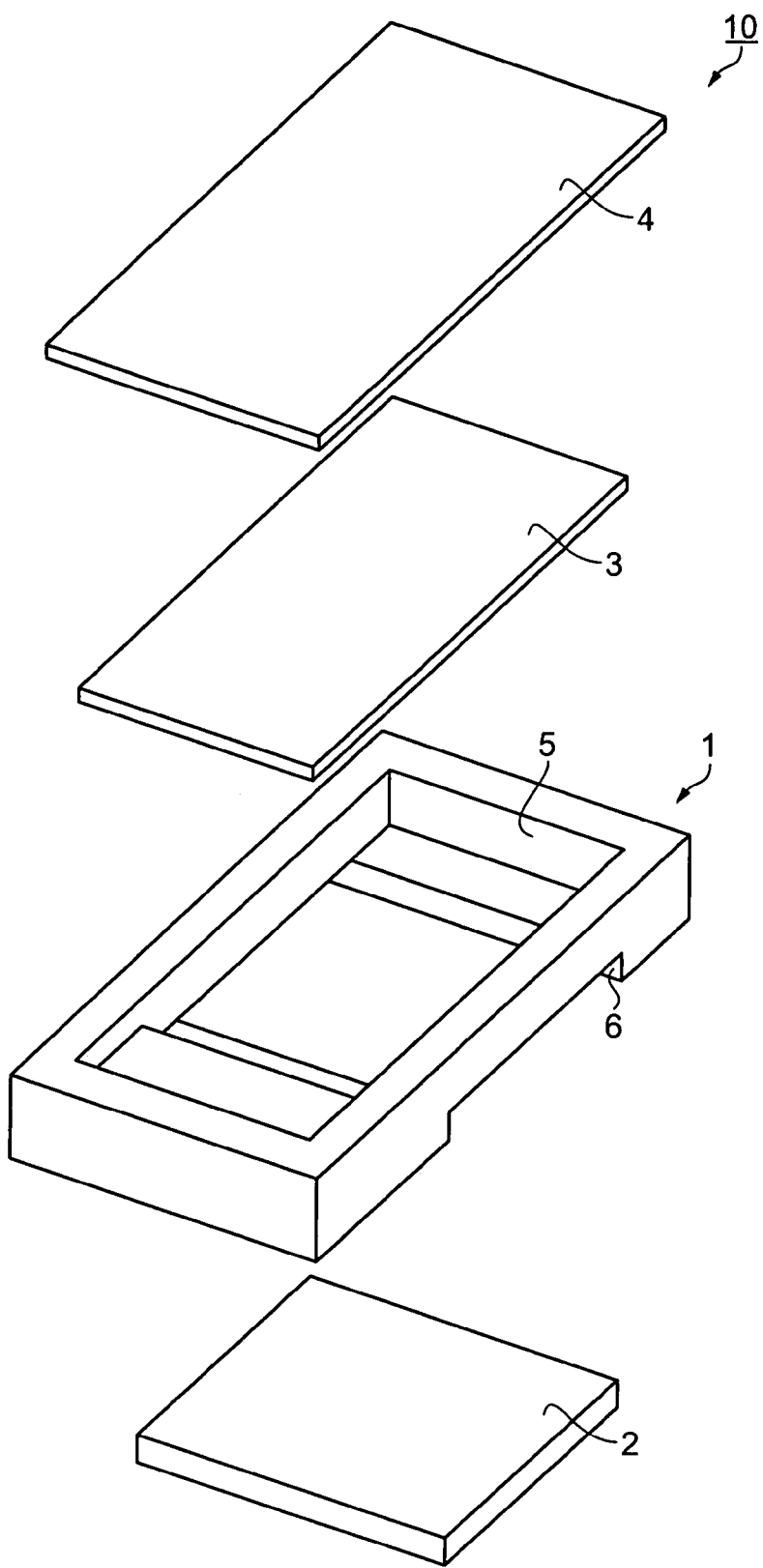
FIG. 1 is an exploded perspective view showing a quartz crystal oscillator of a first embodiment of the invention.

FIG. 1 is an exploded perspective view showing components of this quartz crystal oscillator of the first embodiment.

Figure 2A:
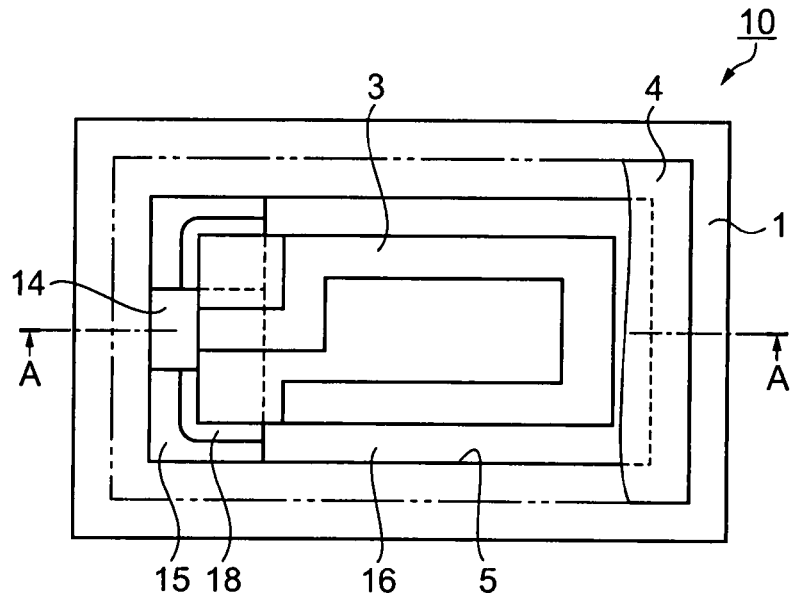
FIG. 2A is a schematic plan view showing the quartz crystal oscillator of the first embodiment.
Figure 2B:
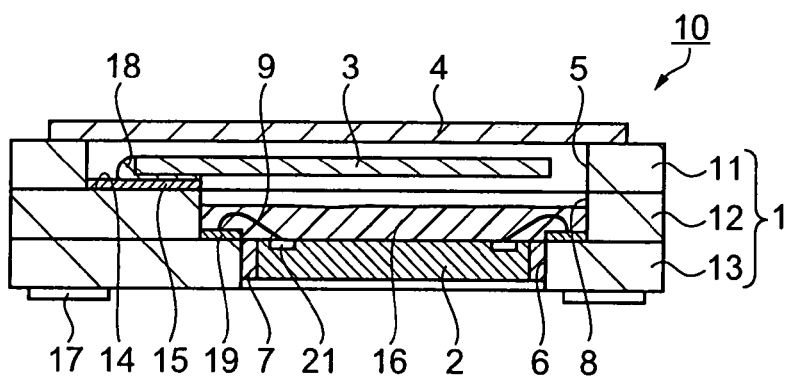
FIG. 2B is a schematic sectional view taken along the line A-A of the FIG. 2A.
Figure 2C:
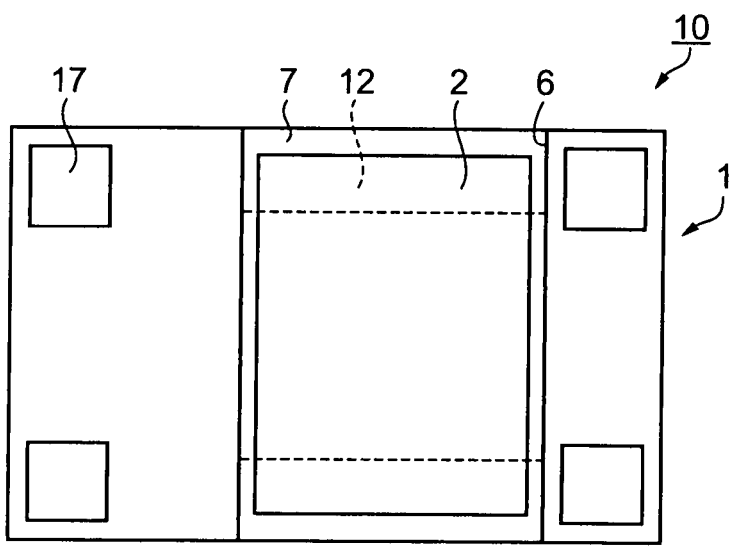
FIG. 2C is a schematic bottom plan view of FIG. 2A.

FIGS. 2A to 2C show a structure of the quartz crystal oscillator of the first embodiment. FIG. 2A is a schematic plan view, FIG. 2B is a schematic sectional view taken along the line A-A of FIG. 2A, and FIG. 2C is a schematic bottom plan view of FIG. 2A.

As shown in FIG. 1, this quartz crystal oscillator 10 is provided with a package 1 made of ceramic and the like, a quartz crystal resonator 3 as a piezoelectric element, an IC chip 2 having a function, for example, to oscillate the quartz crystal resonator 3, and a lid 4 made of metal and the like. Further, the package 1 is provided with a first recessed part 5 on a first surface, and a second recessed part 6 on a second surface making up the front and rear sides of the package 1 along with the first surface.

As shown in FIG. 2B, the package 1 is formed by stacking and sintering circuit substrates 11, 12, and 13 made of, for example, aluminum oxide which is an insulating material.

The first recessed part 5 is formed by forming the circuit substrate 11 in a frame shape. In addition, the second recessed part 6 is formed by forming the circuit substrate 13 in two pieces, and thus two opposing lateral faces of the recessed part 6 are open.

As penetrating from a part of a bottom part 14 of the first recessed part 5 through the second recessed part 6, a penetrating part 8 is formed through the circuit substrate 12.

On the bottom part 14 of the first recessed part 5, a metallization layer made of tungsten and the like is formed and coated by, for example, nickel and gold so as to provide an electrode part 15.

In a similar manner, on the circuit substrate 13, a metallization layer made of tungsten and the like is formed and coated by, for example, nickel and gold so as to provide a plurality of external connecting terminals 17.

The IC chip 2 is disposed in the second recessed part 6 to block at least a part of the penetrating part 8 formed in the package 1, and fixed by an adhesive made of epoxy resin and the like having bonding power at the bottom surface of the circuit substrate 12 forming the second recessed part 6. Thus, the upper surface of the IC chip 2 fixed at the bottom surface of the circuit substrate 12 is on nearly same plane as the upper surface of the circuit substrate 13.

To a space surrounding the lateral faces of the IC chip 2 in the second recessed part 6, a sealing part 7 which is made of epoxy resin having bonding power, low-melting glass providing high air-tightness, or the like is provided. Thus, the penetrating part 8 is closed up by the IC chip 2 and the sealing part 7.

The sealing part 7 infills the space surrounding the lateral faces of the IC chip 2 in the second recessed part 6, but not limited to it. The sealing part 7 may not only infill the space but also cover the bottom surface of the IC chip 2.

On some parts of the upper surface of the IC chip 2 exposed through the penetrating part 8, a plurality of IC connecting pads 21 made of gold (Au), aluminum (Al), or the like are formed. In addition, on the upper surface of the circuit substrate 13, a plurality of internal connecting terminals 19 made of Au and the like are formed. The internal connecting terminals 19 which are located on nearly same plane as the IC connecting pads 21 are connected with the IC connecting pads 21 with metal wires 9 such as Au wire or Al wire. Thus, the IC chip 2 is coupled to the external connecting terminals 17 via the metal wires 9 and the internal connecting terminals 19, permitting the quartz crystal oscillator 10 to couple to the outside.

In a manner covering the IC connecting pads 21, the metal wires 9, and the internal connecting terminals 19, a protection film 16 made of insulating resin and the like is formed.

The quartz crystal resonator 3 is fixed on the electrode part 15 formed in the first recessed part 5 by a conductive adhesive 18 made of resin having bonding power and including conductive particles of silver or the like, and therefore an excitation electrode provided to the quartz crystal resonator 3 is coupled to the electrode part 15. Thus, the quartz crystal resonator 3 is coupled to the IC chip 2 via the electrode part 15 and the metal wire 9.

The lid 4 is disposed and bonded to the package 1 such that the first recessed part 5 formed in the package 1 is closed from the outside. Thus, the quartz crystal oscillator 10 has such structure that the quartz crystal resonator 3 fixed to the electrode part 15 of the first recessed part 5 is disposed in the package 1 to be enclosed air-tightly by the lid 4, the IC chip 2, and the sealing part 7.

In the quartz crystal oscillator 10 of the embodiment, the IC chip 2 is disposed in the second recessed part 6 to block at least a part of the penetrating part 8 formed in the package 1, and fixed by an adhesive made of resin having bonding power at the bottom surface of the circuit substrate 12 forming the second recessed part 6. To the space surrounding the lateral faces of the IC chip 2 in the second recessed part 6, the sealing part 7 made of resin having bonding power, such as epoxy resin, is provided. Thus, the penetrating part 8 is closed up by the IC chip 2 and the sealing part 7. The IC chip 2 is disposed in the second recessed part 6. Therefore, compared to the related art structure in which an IC chip is disposed on the bottom surface of a package recessed part forming a housing recessed part, the quartz crystal oscillator 10 realizes the thickness reduction thereof by the thickness of the bottom of the housing recessed part without undergoing warpage and breakage of the IC chip 2 or the package 1. In addition, the second recessed part 6 can house a larger IC chip 2 than the IC chip housed in the related art housing recessed part.

Modification

Figure 3A:
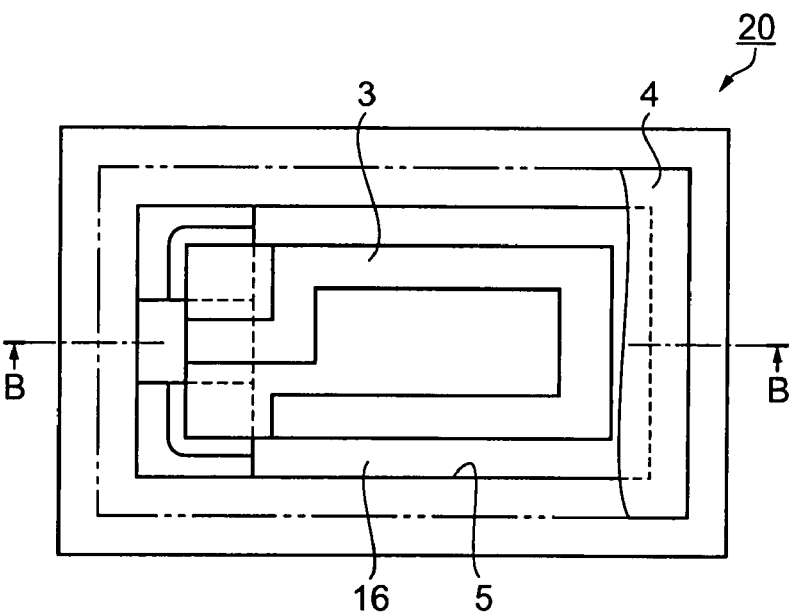
FIGS. 3A to 3C are schematic views showing a modification of the first embodiment.
Figure 3B:
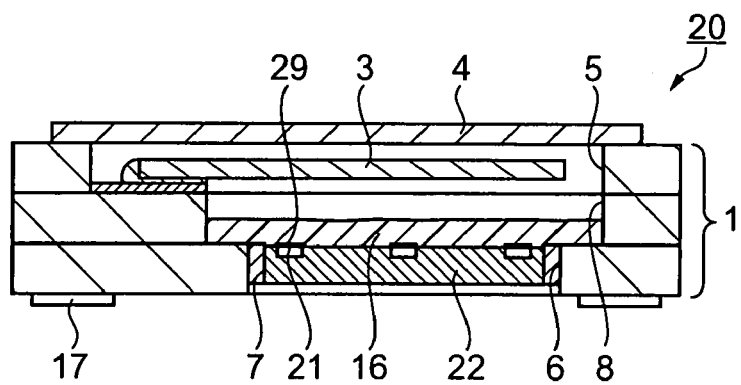
Figure 3C:
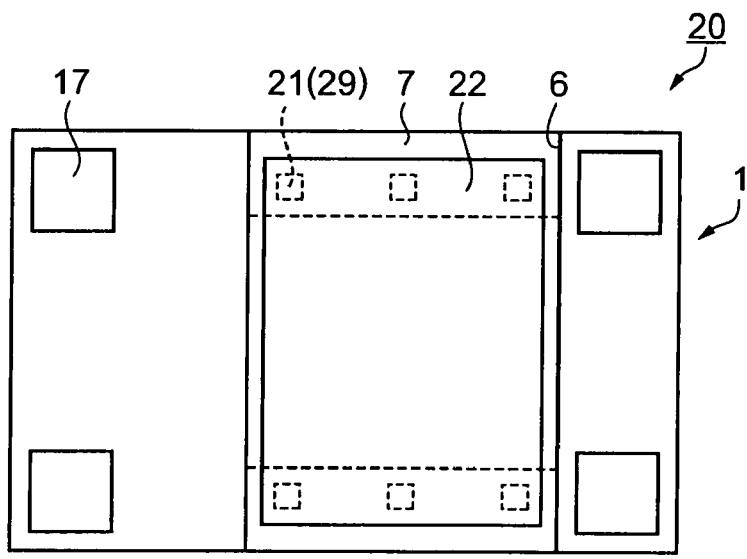

FIGS. 3A to 3C show a modification of the first embodiment. FIG. 3A is a schematic plan view, FIG. 3B is a schematic sectional view taken along the line B-B of FIG. 3A, and FIG. 3C is a schematic bottom plan view of FIG. 3A.

While the IC chip is coupled by the metal wire in the first embodiment, an IC chip is flip-chip mounted in a quartz crystal oscillator 20 of the modification. Other elements have the same structure as the ones of FIGS. 2A to 2C to be given the same reference numbers, and the description thereof is omitted.

An IC chip 22 is flip-chip mounted to the second recessed part 6 formed in the package 1 so as to couple IC connecting pads 21 with internal connecting terminals 29, made of Au and the like and formed on the bottom of the second recessed part 6, via conductive bumps made of Au and the like. The IC chip 22 is coupled to the quartz crystal resonator 3 and the external connecting terminals 17 via the conductive bumps.

Thus, the advantageous effect same as the one in the first embodiment can be obtained in the quartz crystal oscillator 20 in which the IC chip 22 is flip-chip mounted.

Second Embodiment

Figure 4A:
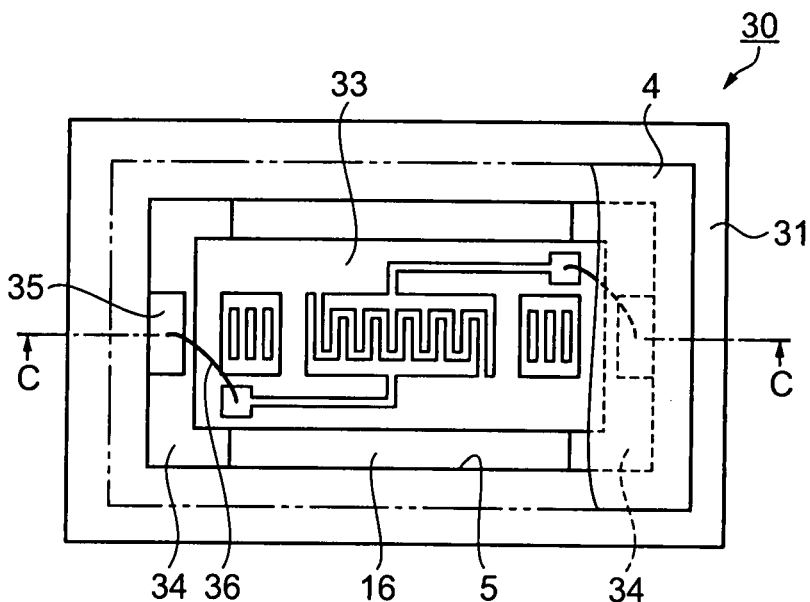
FIG. 4A is a schematic plan view showing an SAW oscillator of a second embodiment of the invention.
Figure 4B:
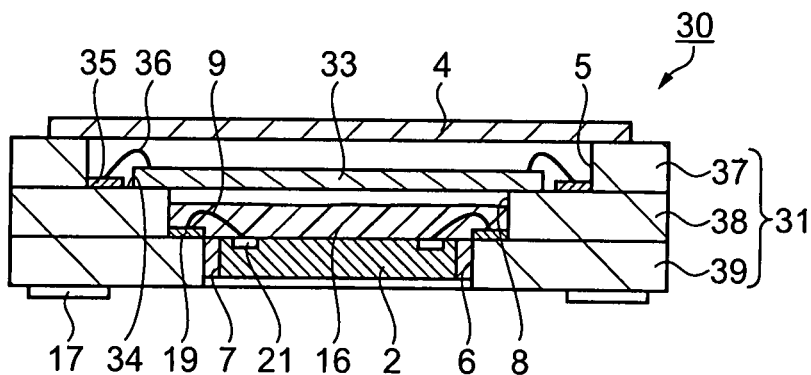
FIG. 4B is a schematic sectional view taken along the line C-C of the FIG. 4A.
Figure 4C:
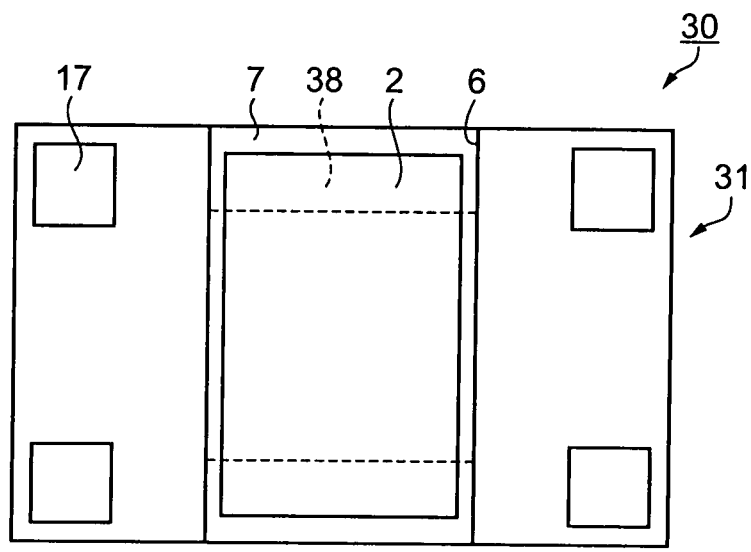
FIG. 4C is a schematic bottom plan view of FIG. 4A.

FIGS. 4A to 4C show a structure of a surface acoustic wave (SAW) oscillator of a second embodiment. FIG. 4A is a schematic plan view, FIG. 4B is a schematic sectional view taken along the line C-C of FIG. 4A, and FIG. 4C is a schematic bottom plan view of the FIG. 4A.

In this SAW oscillator 30, an SAW resonator 33 as a piezoelectric element is fixed by an adhesive and coupled by a metal wire, while the quartz crystal resonator as a piezoelectric element is fixed and coupled by the conductive adhesive in the first embodiment. Other elements have the same structure as the ones of FIGS. 2A to 2C in the first embodiment to be given the same reference numbers, and the description thereof is omitted.

The SAW oscillator 30 is provided with a package 31 made of ceramic and the like, the SAW resonator 33 as a piezoelectric element, an IC chip 2 having a function, for example, to oscillate the SAW resonator 33, and a lid 4 made of metal and the like. Further, the package 31 is provided with a first recessed part 5 on a first surface, and a second recessed part 6 on a second surface making up the front and rear sides of the package 1 along with the first surface.

As penetrating from a part of a bottom part 34 of the first recessed part 5 through the second recessed part 6, a penetrating part 8 is formed through a circuit substrate 38.

The package 31 is formed by stacking and sintering circuit substrates 37, 38, and 39 made of, for example, aluminum oxide which is an insulating material.

The first recessed part 5 is formed by forming the circuit substrate 37 in a frame shape. In addition, the second recessed part 6 is formed by forming the circuit substrate 39 in two pieces, and thus two opposing lateral faces of the second recessed part 6 are open.

As penetrating from a part of the bottom part 34 of the first recessed part 5 through the second recessed part 6, the penetrating part 8 is formed through the circuit substrate 38.

On the bottom part 34 of the first recessed part 5, a metallization layer made of tungsten and the like is formed and coated by, for example, nickel and gold so as to provide an electrode part 35.

In a similar manner, on the circuit substrate 39, a metallization layer made of tungsten and the like is formed and coated by, for example, nickel and gold so as to provide a plurality of external connecting terminals 17.

The IC chip 2 is disposed in the second recessed part 6 to block at least a part of the penetrating part 8 formed in the package 31, and fixed by an adhesive made of epoxy resin, for example, at the bottom surface of the circuit substrate 38 forming the second recessed part 6. Thus, the upper surface of the IC chip 2 fixed at the bottom surface of the circuit substrate 38 is on nearly same plane as the upper surface of the circuit substrate 39.

To a space surrounding the lateral faces of the IC chip 2 in the second recessed part 6, a sealing part 7 which is made of epoxy resin having bonding power is provided. Thus, the penetrating part 8 is closed up by the IC chip 2 and the sealing part 7.

The sealing part 7 infills only the space surrounding the lateral faces of the IC chip 2 in the second recessed part 6, but not limited to it. The sealing part 7 may not only infill the space but also cover the bottom surface of the IC chip 2.

On some parts of the upper surface of the IC chip 2 exposed through the penetrating part 8, a plurality of IC connecting pads 21 made of gold (Au), aluminum (Al), or the like are formed. In addition, on the upper surface of the circuit substrate 39, a plurality of internal connecting terminals 19 made of Au and the like are formed. The internal connecting terminals 19 which are located on nearly same plane as the IC connecting pads 21 are connected with the IC connecting pads 21 with metal wires 9 such as Au wire or Al wire. Thus, the IC chip 2 is coupled to the external connecting terminals 17 via the metal wires 9 and the internal connecting terminals 19, permitting the SAW oscillator 30 to couple to the outside.

In a manner covering the IC connecting pads 21, the metal wires 9, and the internal connecting terminals 19, a protection film 16 made of insulating resin and the like is formed.

The SAW resonator 33 is fixed at the bottom part 34 of the first recessed part 5 by an adhesive made of resin having bonding power, and an excitation electrode provided to the SAW resonator 33 is coupled to the electrode part 35 by a metal wire 36 such as aluminum (Al) wire. Thus, the SAW resonator 33 is coupled to the IC chip 2 via the metal wire 36 and the electrode part 35.

The lid 4 is disposed and bonded to the package 31 such that the first recessed part 5 formed in the package 31 is closed from the outside. Thus, the SAW oscillator 30 has such structure that the SAW resonator 33 fixed at the bottom part 34 of the first recessed part 5 is enclosed air-tightly in the package 31 with the lid 4, the IC chip 2, and the sealing part 7.

In the SAW oscillator 30 of the embodiment, the IC chip 2 is disposed in the second recessed part 6 to block at least a part of the penetrating part 8 formed in the package 31, and fixed by an adhesive made of resin having bonding power at the bottom surface of the circuit substrate 38 forming the second recessed part 6. To the space surrounding the lateral faces of the IC chip 2 in the second recessed part 6, the sealing part 7 made of resin having bonding power, such as epoxy resin, is provided. Thus, the penetrating part 8 is closed up by the IC chip 2 and the sealing part 7. The IC chip 2 is disposed in the second recessed part 6. Therefore, compared to the related art structure in which an IC chip is disposed on the bottom surface of a package recessed part forming a housing recessed part, the SAW oscillator 30 realizes the thickness reduction thereof by the thickness of the bottom of the housing recessed part without undergoing warpage and breakage of the IC chip 2 or the package 31. In addition, the second recessed part 6 can house a larger IC chip 2 than the IC chip housed in the related art housing recessed part.

The second embodiment describes the SAW oscillator 30 having such structure that the IC connecting pads 21 are conductively coupled with the internal connecting terminals 19 with the metal wires 9, but the invention is not limited to it. The coupling structure of the SAW oscillator 30 may be changed to the flip-chip mounting structure using conductive bumps like the quartz crystal oscillator 20 of FIGS. 3A to 3C.

It is to be noted that this invention is not limited to the aforementioned embodiments but includes various modifications or improvements within a scope of a purpose of this invention.

For example, the aforementioned embodiments adopt the structure in which two opposing lateral faces of the second recessed part are open, but a structure in which at least one lateral face is open may be adopted.

Further, the sealing part is made of resin having bonding power, such as epoxy resin, in the aforementioned embodiments, but the sealing part may be made of insulating material, such as glass and the like.

The piezoelectric device of the present invention may be applied not only to the aforementioned quartz crystal oscillators, but also to a temperature compensated crystal oscillator, a voltage controlled crystal oscillator, or a surface acoustic wave filter.

What is claimed is:

1. A piezoelectric device, comprising:
    a package including a first recessed part provided on a first surface of the package, a second recessed part provided on a second surface of the package, and a penetrating part passing partially from the first recessed part through the second recessed part;
    a piezoelectric element housed in the first recessed part;
    a lid disposed on the upper side of the first recessed part;
    an IC chip disposed and fixed in the second recessed part of the package so as to block a part of the penetrating part; and
    a sealing part provided to the second recessed part, wherein the IC chip and the sealing part close up the penetrating part and the lid seals the first recessed part air-tightly.

2. The piezoelectric device according to claim 1, wherein at least one lateral face of the second recessed part is open.

* * * * *